(12) United States Patent
Yamauchi et al.

(10) Patent No.: US 11,226,376 B2
(45) Date of Patent: Jan. 18, 2022

(54) STORAGE BATTERY CONTROL DEVICE

(71) Applicant: Hitachi Automotive Systems, Ltd., Hitachinaka (JP)

(72) Inventors: Shin Yamauchi, Tokyo (JP); Kei Sakabe, Tokyo (JP); Masahiro Yonemoto, Tokyo (JP); Takanori Yamazoe, Tokyo (JP); Keiichiro Ohkawa, Hitachinaka (JP); Ryohhei Nakao, Hitachinaka (JP)

(73) Assignee: Vehicle Energy Japan Inc., Hitachinaka (JP)

( * ) Notice: Subject to any disclaimer, the term of this patent is extended or adjusted under 35 U.S.C. 154(b) by 0 days.

(21) Appl. No.: 15/738,281

(22) PCT Filed: Aug. 8, 2016

(86) PCT No.: PCT/JP2016/073226
§ 371 (c)(1),
(2) Date: Dec. 20, 2017

(87) PCT Pub. No.: WO2017/043239
PCT Pub. Date: Mar. 16, 2017

(65) Prior Publication Data
US 2018/0210036 A1  Jul. 26, 2018

(30) Foreign Application Priority Data

Sep. 9, 2015  (JP) .............................. JP2015-177560

(51) Int. Cl.
*H01M 10/44* (2006.01)
*G01R 31/396* (2019.01)
(Continued)

(52) U.S. Cl.
CPC .............. *G01R 31/396* (2019.01); *B60L 3/12* (2013.01); *B60L 58/12* (2019.02); *B60L 58/16* (2019.02);
(Continued)

(58) Field of Classification Search
CPC .. G01R 31/396; G01R 31/392; G01R 31/382; H02J 7/00; H02J 7/008; H02J 7/0091;
(Continued)

(56) References Cited

U.S. PATENT DOCUMENTS

| 8,648,603 B2 | 2/2014 | Harada |
| 8,820,446 B2 | 9/2014 | Kusumi |

(Continued)

FOREIGN PATENT DOCUMENTS

| CN | 102439780 A | 5/2012 |
| CN | 102648104 A | 8/2012 |

(Continued)

OTHER PUBLICATIONS

Japanese-language Office Action issued in counterpart Japanese Application No. 2015-177560 dated Jul. 17, 2018 with unverified English translation (six pages).

(Continued)

*Primary Examiner* — Richard Isla
*Assistant Examiner* — Johali A Torres Ruiz
(74) *Attorney, Agent, or Firm* — Crowell & Moring LLP

(57) ABSTRACT

To perform charge/discharge control of a storage battery at an appropriate timing. In a battery controller, a battery information acquisition unit acquires information on the storage battery. A degradation progression rate calculation unit calculates a degradation progression rate of the storage battery based on the information acquired by the battery information acquisition unit. A limit value setting unit sets a limit value for controlling charge/discharge of the storage (Continued)

battery based on the degradation progression rate calculated by the degradation progression rate calculation unit. A timing determination unit determines a timing at which the limit value needs to be output based on the information acquired by the battery information acquisition unit. A limit value output unit outputs the limit value to a host controller based on the timing determined by the timing determination unit.

6 Claims, 14 Drawing Sheets

(51) Int. Cl.
| | | |
|---|---|---|
| H01M 10/48 | (2006.01) | |
| H02J 7/00 | (2006.01) | |
| B60L 3/12 | (2006.01) | |
| B60L 58/16 | (2019.01) | |
| H01M 10/42 | (2006.01) | |
| B60L 58/12 | (2019.01) | |
| G01R 31/382 | (2019.01) | |
| G01R 31/392 | (2019.01) | |

(52) U.S. Cl.
CPC ......... *H01M 10/425* (2013.01); *H01M 10/44* (2013.01); *H01M 10/48* (2013.01); *H02J 7/00* (2013.01); *H02J 7/008* (2013.01); *H02J 7/0091* (2013.01); *B60L 2240/545* (2013.01); *B60L 2240/549* (2013.01); *G01R 31/382* (2019.01); *G01R 31/392* (2019.01); *H01M 10/4257* (2013.01); *H01M 2010/4271* (2013.01); *H01M 2010/4278* (2013.01); *H02J 7/0063* (2013.01)

(58) Field of Classification Search
CPC ........ B60L 58/12; B60L 58/16; H01M 10/44; H01M 10/48; H01M 10/425
See application file for complete search history.

(56) References Cited

U.S. PATENT DOCUMENTS

| | | | | |
|---|---|---|---|---|
| 2009/0321163 | A1* | 12/2009 | Suzui | H02J 7/0048 180/65.265 |
| 2013/0035813 | A1* | 2/2013 | Kusumi | B60L 58/16 701/22 |
| 2013/0038333 | A1 | 2/2013 | Harada | |
| 2013/0069598 | A1* | 3/2013 | Tanaka | B60L 50/64 320/134 |
| 2013/0293200 | A1 | 11/2013 | Obata et al. | |
| 2014/0225571 | A1* | 8/2014 | Obata | H02J 7/007 320/136 |
| 2014/0339891 | A1 | 11/2014 | Ohkawa et al. | |
| 2015/0207341 | A1 | 7/2015 | Kagami | |
| 2015/0326967 | A1* | 11/2015 | Otani | H04R 1/028 381/114 |
| 2016/0039405 | A1* | 2/2016 | Terayama | B60K 6/547 701/22 |
| 2016/0159236 | A1 | 6/2016 | Tagome et al. | |
| 2016/0327613 | A1* | 11/2016 | Tenmyo | H02J 7/00712 |

FOREIGN PATENT DOCUMENTS

| | | |
|---|---|---|
| CN | 104488130 A | 4/2015 |
| JP | 2003-297435 A | 10/2003 |
| JP | 2007-323999 A | 12/2007 |
| JP | 2008-24124 A | 2/2008 |
| JP | 2013-65481 A | 4/2013 |
| JP | 2014-3826 A | 1/2014 |
| JP | 2015-70753 A | 4/2015 |
| WO | WO 2015/001751 A1 | 1/2015 |
| WO | WO 2015/045505 A1 | 4/2015 |

OTHER PUBLICATIONS

Japanese-language Office Action issued in counterpart Japanese Application No. 2015-177560 dated Oct. 2, 2018 with unverified English translation (eight pages).
International Search Report (PCT/ISA/210) issued in PCT Application No. PCT/JP2016/073226 dated Nov. 29, 2016 with English translation (Four (4) pages).
Japanese-language Written Opinion (PCT/ISA/237) issued in PCT Application No. PCT/JP2016/073226 dated Nov. 29, 2016 (Four (4) pages).
Partial Supplementary European Search Report issued in counterpart European Application No. 16844103.8 dated Jun. 18, 2019 (16 pages).
Chinese-language Office Action issued in Chinese Application No. 201680037242.5 dated Jun. 30, 2020 with English translation (15 pages).
Extended European Search Report issued in European Application No. 16844103.8 dated Dec. 19, 2019 (15 pages).
Chinese-language Office Action issued in Chinese Application No. 201680037242.5 dated Apr. 7, 2021 with English translation (12 pages).

\* cited by examiner

STORAGE BATTERY CONTROL DEVICE

TECHNICAL FIELD

The present invention relates to a storage battery control device.

BACKGROUND ART

Conventionally, an on-board battery system, which is mounted on a hybrid electric vehicle (HEV) or a plug-in hybrid electric vehicle (PHEV) and uses a lithium ion secondary battery as a storage battery, has been used. The price of the storage battery in such a vehicle battery system generally occupies a large proportion in the price of the whole vehicle, and it is necessary to replace the storage battery when the life of the storage battery runs out faster than the life of the vehicle, thereby resulting in great cost. For this reason, a battery system, which performs charge/discharge control so as to make the life of the storage battery as long as possible, has been developed in recent years. For example, PTL 1 discloses a technique of calculating a degradation rate of a storage battery, comparing the calculated degradation rate with a reference degradation rate, and controlling charge/discharge of the storage battery according to a result of the comparison.

CITATION LIST

Patent Literature

PTL 1: JP 2007-323999 A

SUMMARY OF INVENTION

Technical Problem

In the charge/discharge control of the storage battery as in PTL 1, it is necessary to determine a timing for performing the charge/discharge control in consideration of a period until a degradation state of the storage battery is affected by a change of a control state with respect to the storage battery. However, such a point is not sufficiently taken into consideration in the related art, and thus, it is difficult to perform the charge/discharge control of the storage battery at an appropriate timing.

Solution to Problem

A storage battery control device according to one aspect of the present invention includes: a battery information acquisition unit that acquires information on a storage battery; a degradation progression rate calculation unit that calculates a degradation progression rate of the storage battery based on the information acquired by the battery information acquisition unit; a limit value setting unit that sets a limit value for controlling charge/discharge of the storage battery based on the degradation progression rate calculated by the degradation progression rate calculation unit; a timing determination unit that determines a timing at which the limit value needs to be output based on the information acquired by the battery information acquisition unit; and a limit value output unit that outputs the limit value based on the timing determined by the timing determination unit. A storage battery control device according to another aspect of the present invention includes: a battery information acquisition unit that acquires information on a storage battery; a degradation progression rate calculation unit that calculates a degradation progression rate of the storage battery based on the information acquired by the battery information acquisition unit; a limit value calculation unit that calculates a limit value for controlling charge/discharge of the storage battery based on the degradation progression rate calculated by the degradation progression rate calculation unit; a battery use state estimation unit that estimates a use state of the storage battery based on the information acquired by the battery information acquisition unit; a correction permission determination unit that determines whether or not to permit correction of the limit value based on the use state of the storage battery estimated by the battery use state estimation unit and use time of the storage battery; and a limit value correction unit that corrects the set limit value based on the limit value obtained by the limit value calculation unit and a determination result of the correction permission determination unit.

Advantageous Effects of Invention

According to the present invention, it is possible to perform the charge/discharge control of the storage battery at an appropriate timing.

DESCRIPTION OF EMBODIMENTS

Hereinafter, one embodiment of the present invention will be described with reference to the drawings.

First Embodiment

Figure 1:
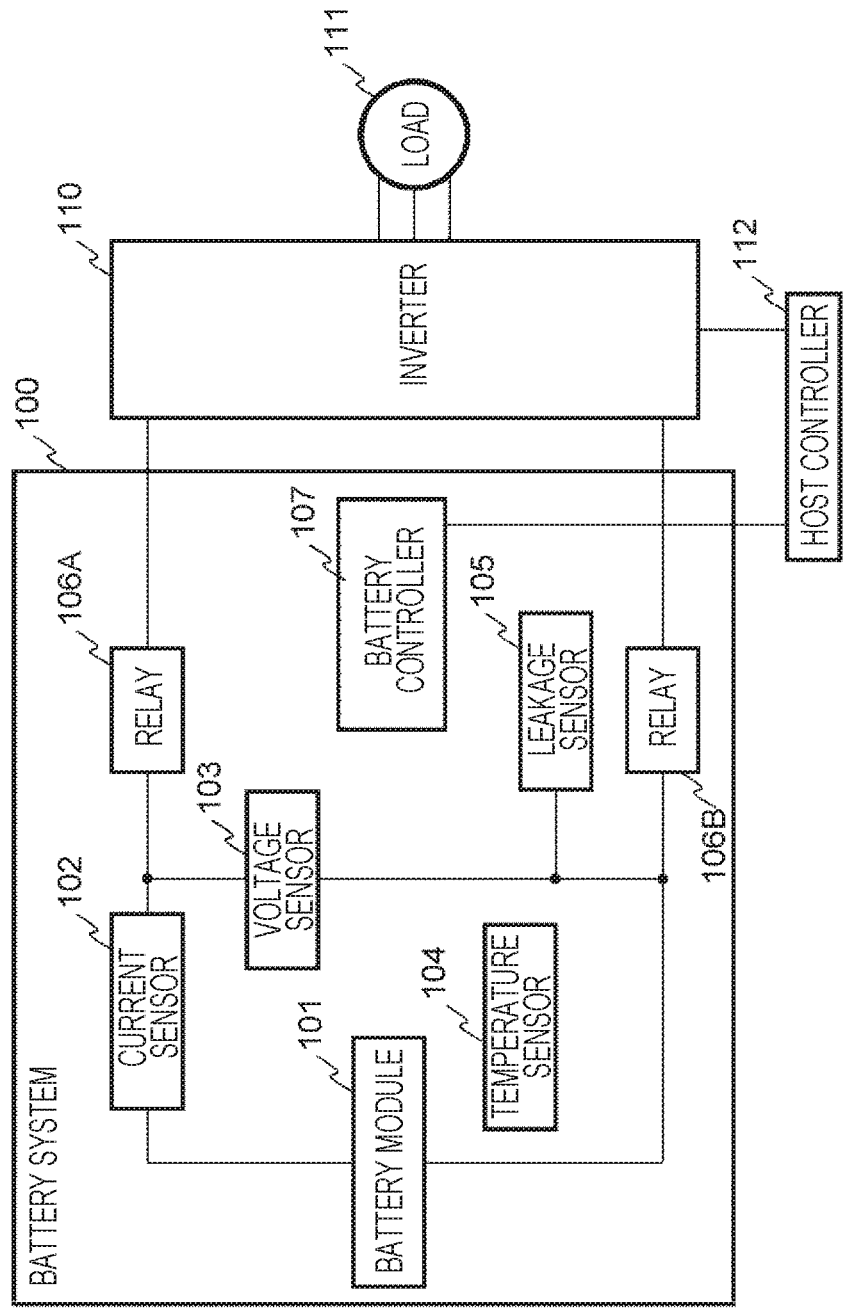
FIG. 1 is a diagram illustrating a configuration of a battery system to which a storage battery control device according to an embodiment of the present invention is applied.

FIG. 1 is a diagram illustrating a configuration of a battery system to which a storage battery control device according to one embodiment of the present invention is applied. A battery system 100 illustrated in FIG. 1 is connected to an inverter 110 and a host controller 112. A load 111 is connected to the inverter 110.

The inverter 110 is a bidirectional inverter that operates under control of the host controller 112. The inverter 110 converts DC power supplied from the battery system 100 into AC power and outputs the converted power to the load 111. The load 111 is, for example, a three-phase AC motor mounted on a vehicle, and generates a driving force of the vehicle by rotationally driving the load using the AC power supplied from the inverter 110. In addition, when regenerative power generation is performed by operating the load 111 as a generator using kinetic energy of the vehicle, AC power is output from the load 111. In this case, the inverter 110 converts the AC power output from the load 111 into DC power, and outputs the obtained DC power to the battery system 100 to be stored therein. In this manner, the charge/discharge of the battery system 100 is performed by operating the inverter 110 according to the control of the host controller 112.

Incidentally, the present invention is not limited to the configuration illustrated in FIG. 1 as long as the charge/discharge of the battery system 100 can be appropriately controlled. For example, a charging system different from the inverter 110 may be connected to the battery system 100 such that charge of the battery system 100 is performed as needed using this charging system.

The battery system 100 includes a battery module 101, a current sensor 102, a voltage sensor 103, a temperature sensor 104, a leakage sensor 105, a relay 106A, a relay 106B, and a battery controller 107.

The battery module 101 is a chargeable/dischargeable storage battery configured by connecting a plurality of unit batteries in series or in series and in parallel. Incidentally, the battery module 101 may be divided into two or more groups, and a circuit breaker which can be manually operated may be provided between the groups. In this manner, it is possible to prevent occurrence of an electric shock accident or a short-circuit accident by opening the circuit breaker at the time of assembling, disassembling, or checking the battery system 100.

The current sensor 102 detects charge/discharge current flowing in the battery module 101. The voltage sensor 103 detects voltage of the battery module 101. The temperature sensor 104 detects temperature of the battery module 101. The leakage sensor 105 detects insulation resistance of the battery module 101. Each detection result of the current sensor 102, the voltage sensor 103, the temperature sensor 104, and the leakage sensor 105 is output to the battery controller 107.

The relays 106A and 106B are configured to switch an electrical connection state between the battery module 101 and the inverter 110, and are controlled by the battery controller 107 or the host controller 112. The relay 106A is connected between a positive electrode side of the battery module 101 and the inverter 110, and the relay 106B is connected between a negative electrode side of the battery module 101 and the inverter 110. Incidentally, any one of the relays 106A and 106B may be omitted. In addition, a pre-charge relay and a resistor may be provided in parallel with the relay 106A or 106B in order to limit inrush current. In this case, when connecting the battery module 101 and the inverter 110, it is sufficient to turn on the pre-charge relay first, and turn on the relay 106A or 106B and turn off the pre-charge relay after the current becomes sufficiently small.

The battery controller 107 corresponds to a storage battery control device according to one embodiment of the present invention. The battery controller 107 acquires the respective detection results of the current sensor 102, the voltage sensor 103, the temperature sensor 104, and the leakage sensor 105 and controls the battery system 100 based on these detection results. For example, the battery controller 107 calculates a state of charge (SOC) and a state of health (SOH) of the battery module 101 based on the detection result of the charge/discharge current obtained by the current sensor 102 and the detection result of the voltage obtained by the voltage sensor 103. Further, charge/discharge control of the battery module 101 and balancing control for equalizing the SOC of each unit cell of the battery module 101 are performed based on these calculation results. In addition, the battery controller 107 determines whether or not the battery module 101 is in a leakage state or in a state where leakage is likely to occur based on the detection result of the insulation resistance obtained by the leakage sensor 105, and stops the operation of the battery system 100 when determining that the battery module 101 is in such states. In addition, the battery controller 107 can execute various types of processing.

Incidentally, the battery controller 107 sets a limit value for appropriately maintaining the life of the battery module 101 and determines a timing at which the limit value needs to be output during the charge/discharge control of the battery module 101. Further, the limit value is output to the host controller 112 at the determined timing. Details of the charge/discharge control of the battery module 101 by the battery controller 107 will be described later in more detail.

The host controller 112 controls operation states of the battery system 100 and the inverter 110 based on various types of information on the battery module 101 transmitted from the battery controller 107.

Figure 2:
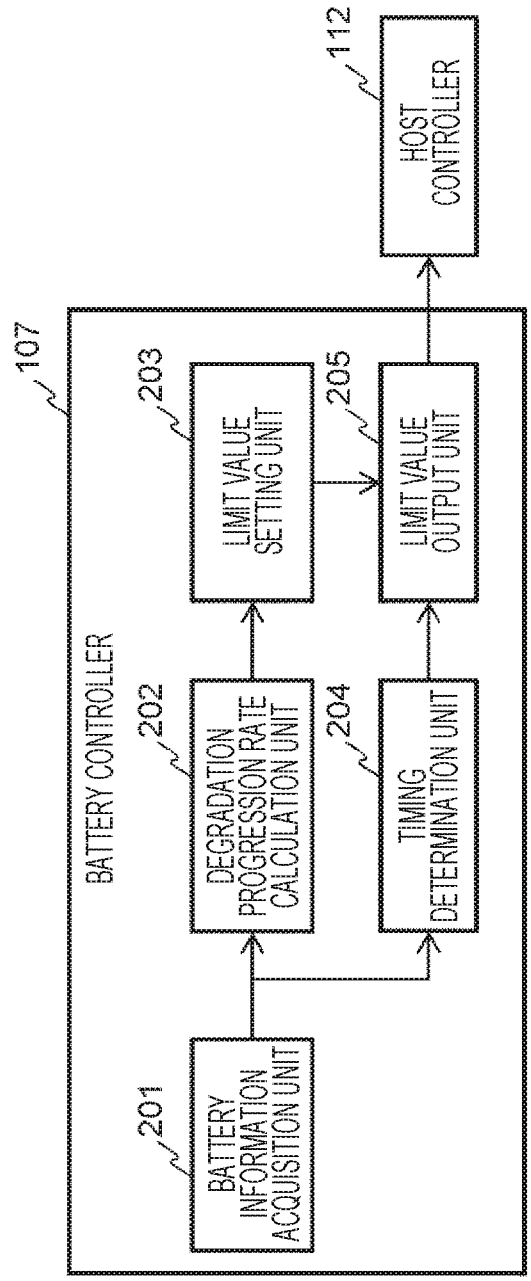
FIG. 2 is a functional block diagram of a battery controller according to a first embodiment of the present invention.

Next, details of the charge/discharge control of the battery module 101 by the battery controller 107 will be described. FIG. 2 is a functional block diagram of the battery controller 107 according to the first embodiment of the present invention. As illustrated in FIG. 2, the battery controller 107 according to the present embodiment is constituted by each functional block of a battery information acquisition unit 201, a degradation progression rate calculation unit 202, a limit value setting unit 203, a timing determination unit 204, and a limit value output unit 205. The battery controller 107 can realize these functional blocks, for example, by executing a predetermined program using a CPU.

The battery information acquisition unit 201 acquires various types of information on a state of the battery module 101 based on the respective detection results of the current sensor 102, the voltage sensor 103, and the temperature sensor 104. The battery information acquisition unit 201 acquires, for example, the charge/discharge current of the battery module 101 detected by the current sensor 102, the temperature of the battery module 101 detected by the temperature sensor 104, and the like as information on the battery module 101. In addition, the SOC of the battery module 101 may be calculated based on the detection result of the charge/discharge current obtained by the current sensor 102 and the detection result of the voltage obtained by the voltage sensor 103, and the calculated SOC may be acquired as the information on the battery module 101. Further, it is also possible to acquire use time of the battery module 101 measured using a timer (not illustrated) built in the battery controller 107, traveling distance of the vehicle on which the battery module 101 is mounted, and the like as the information on the battery module 101. That is, the battery information acquisition unit 201 can acquire at least any one of the above-described various types of information relating to the state of the battery module 101. Incidentally, information other than those described above may be acquired as the information on the battery module 101.

The degradation progression rate calculation unit 202 calculates a degradation progression rate of the battery module 101 based on the information on the battery module 101 acquired by the battery information acquisition unit 201. For example, the degradation progression rate calculation unit 202 records history of the information on the battery module 101 acquired by the battery information acquisition unit 201 in association with the SOH of the battery module 101. It is possible to calculate the degradation progression rate of the battery module 101 by estimating a change of a future SOH based on the information recorded in this manner.

The limit value setting unit 203 sets a limit value for controlling the charge/discharge of the battery module 101 based on the degradation progression rate calculated by the degradation progression rate calculation unit 202. For example, the limit value setting unit 203 obtains a life prediction value of the battery module 101 based on the calculated degradation progression rate, and compares the life prediction value with a life target value set in advance. As a result, if a gap between the lift target value and the life prediction value is large, the setting of the limit value regarding the charge/discharge of the battery module 101 is changed in a retrenching direction or a relaxing direction such that the gap decreases. At this time, it is possible to use allowable charge/discharge current, allowable charge/discharge power, an allowable temperature range, an allowable SOC range, and the like as the limit value of the battery module 101.

The timing determination unit 204 determines the timing at which the limit value, set by the limit value setting unit 203, needs to be output to the host controller 112 based on the information on the battery module 101 acquired by the battery information acquisition unit 201. Incidentally, a specific method of determining the timing using the timing determination unit 204 will be described later.

The limit value output unit 205 outputs the limit value set by the limit value setting unit 203 to the host controller 112 based on the timing determined by the timing determination unit 204. When the limit value is output from the limit value output unit 205, the host controller 112 controls the battery system 100 and the inverter 110 according to this limit value and performs the charge/discharge control of the battery module 101.

Figure 3:
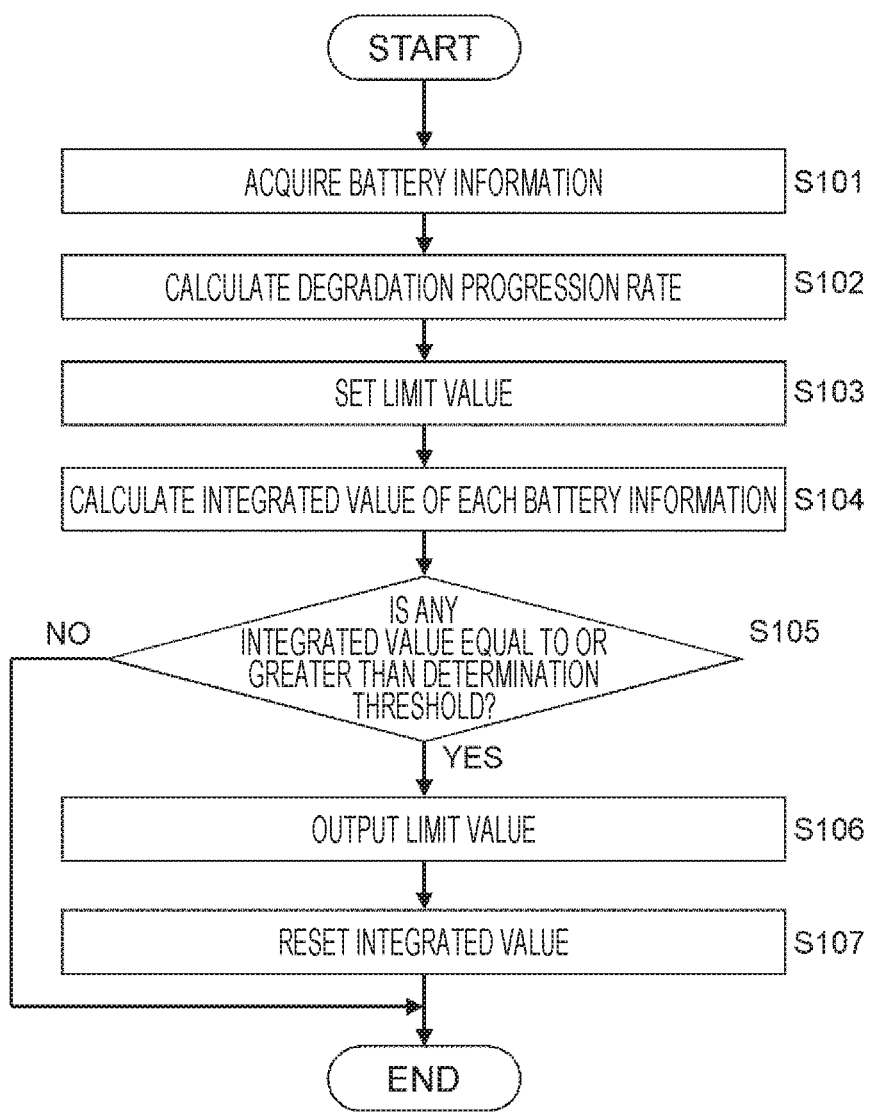
FIG. 3 is a flowchart of charge/discharge control of a battery module according to the first embodiment of the present invention.

FIG. 3 is a flowchart of the charge/discharge control of the battery module 101 using the battery controller 107 according to the first embodiment of the present invention. The battery controller 107 of the present embodiment executes the charge/discharge control of the battery module 101 at every predetermined processing cycle according to the flowchart of FIG. 3.

In step S101, the battery controller 107 acquires various types of information on the battery module 101 described above by the battery information acquisition unit 201.

In step S102, the battery controller 107 calculates the degradation progression rate of the battery module 101 using the degradation progression rate calculation unit 202 based on the information on the battery module 101 acquired in step S101.

In step S103, the battery controller 107 sets the limit value in the charge/discharge of the battery module 101 using the limit value setting unit 203 based on the degradation proceeding rate of the battery module 101 calculated in step S102.

In step S104, the battery controller 107 calculates the integrated value of each information on the battery module 101 acquired in step S101 using the timing determination unit 204. Here, each integrated value is calculated for various types of information described above. Specifically, integrated values are obtained by integrating measurement values obtained at predetermined time intervals, respectively, regarding the charge/discharge current and the temperature. Incidentally, when charge current and discharge current are distinguished from each other depending on a positive or negative sign of a measurement value, it is preferable to integrate absolute values in order to sum these values. In addition, integrated values are obtained by integrating measurement values obtained at predetermined time intervals, respectively, regarding the use time and the traveling distance of the vehicle, which is similar to the charge/discharge current and the temperature. On the other hand, it is preferable to integrate absolute values of change amount of the SOC every measurement time, rather than directly integrating the SOC obtained at predetermined time intervals.

In step S105, the battery controller 107 determines whether or not any integrated value among the integrated values calculated in step S104 is equal to or greater than a predetermined determination threshold using the timing determination unit 204. As a result, when at least one integrated value is equal to or greater than the determination threshold, the timing determination unit 204 notifies the limit value output unit 205 of such a determination result, and the processing proceeds to step S106. On the other hand, when all the integrated values are less than the determination threshold, the processing illustrated in the flowchart of FIG. 3 is ended. In this case, the limit value is not output from the battery controller 107 to the host controller 112.

Figure 4:
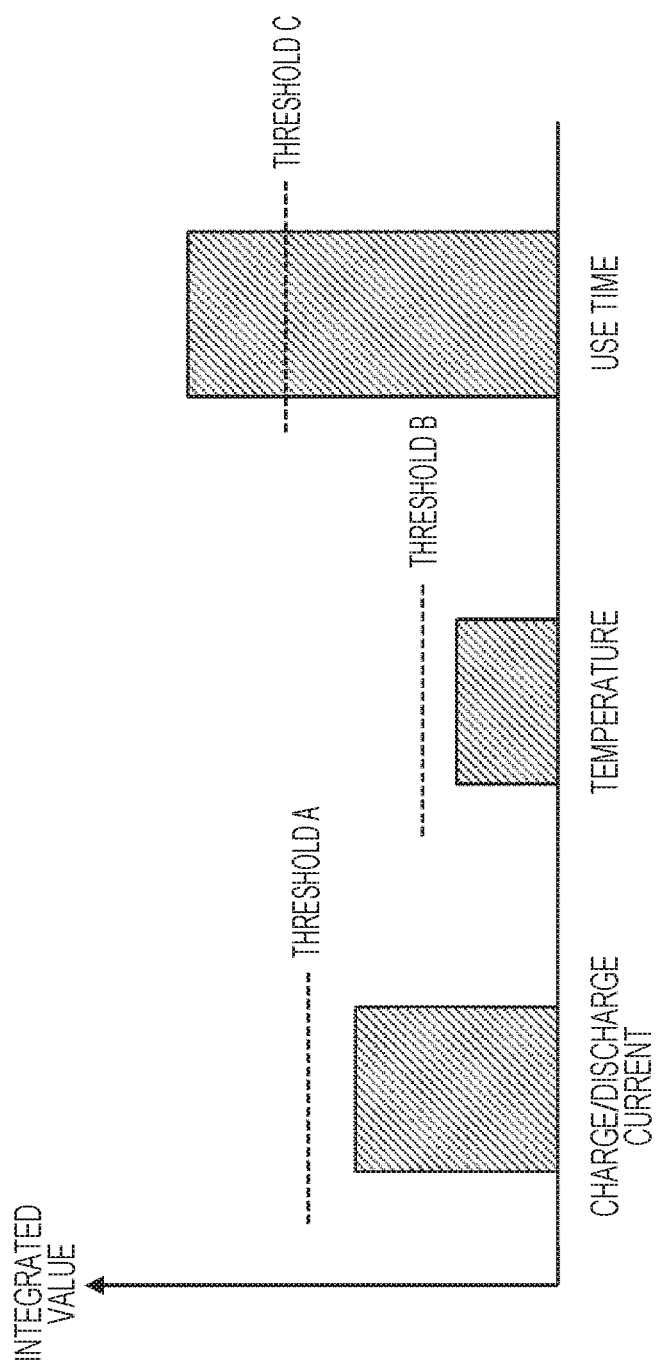
FIG. 4 is a diagram illustrating a timing determination method according to the first embodiment of the present invention.

FIG. 4 is a diagram illustrating a timing determination method performed by the timing determination unit 204 according to the first embodiment of the present invention. FIG. 4 illustrates an example in which an integrated value is obtained for each information of the charge/discharge current, the temperature, and the use time of the battery module 101, and the respective integrated values are compared with thresholds A, B, and C, respectively. Incidentally, the thresholds A, B, and C represent the above-described determination thresholds set, respectively, regarding the integrated values of the charge/discharge current, the temperature, and the use time. These thresholds can be determined according to characteristics of the battery module 101 and use environment.

In the example of FIG. 4, the integrated value of the charge/discharge current is less than the threshold A, and the integrated value of the temperature is less than the threshold B. On the other hand, the integrated value of the use time is equal to or greater than the threshold C. Thus, the timing determination unit 204 makes affirmative determination in step S105 of FIG. 3 and causes the processing to proceed to step S106 as described above.

Returning to the description of FIG. 3, the battery controller 107 outputs the limit value set in step S103 to the host controller 112 using the limit value output unit 205 in step S106.

In step S107, the battery controller 107 resets the respective integrated values calculated in step S104 to zero using the timing determination unit 204. Accordingly, integration is newly started from the next processing. After step S107 is executed, the battery controller 107 ends the processing illustrated in the flowchart of FIG. 3.

Figure 5:
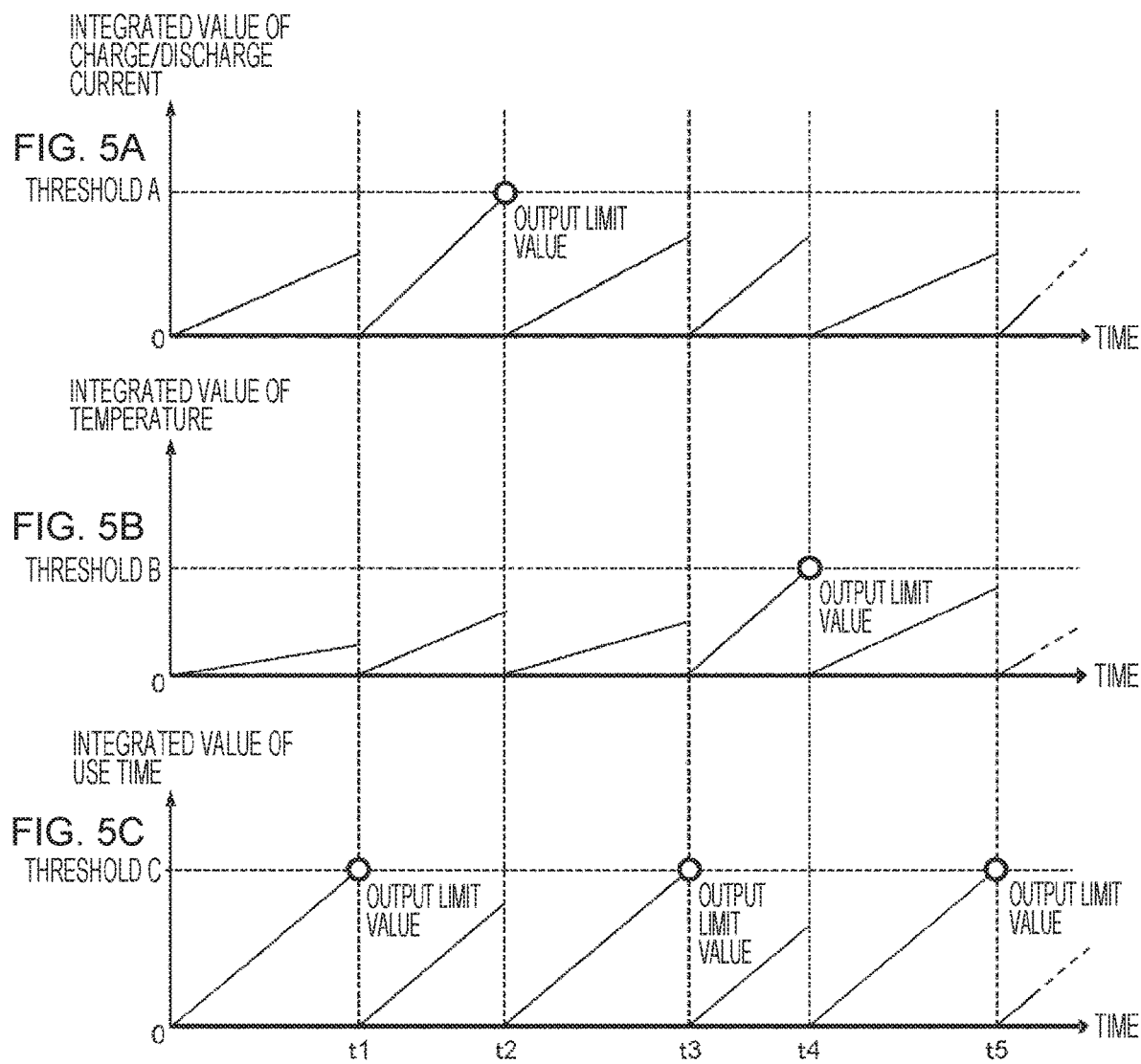
FIG. 5A to 5C are diagrams illustrating an example of a relationship between a change of an integrated value and a limit value output timing.

FIG. 5 is a diagram illustrating an example of a relationship between a change of an integrated value and a limit value output timing. In FIG. 5, (a) illustrates how the integrated value of charge/discharge current changes, (b) illustrates how the integrated value of temperature changes, and (c) illustrates how the use time changes.

When the battery controller 107 starts the charge/discharge control, the integrated values of the charge/discharge current, the temperature, and the use time increase as illustrated in (a), (b) and (c), respectively. It is assumed that the integrated value of the use time reaches the threshold C at time t1, as a result, as illustrated in (c). At this time, the limit value is output from the battery controller 107 to the host controller 112, and the respective integrated values are reset to zero.

After time t1, the respective integrated values of the charge/discharge current, the temperature, and the use time rise again. Here, it is assumed that the integrated value of the charge/discharge current reaches the threshold A at time t2, as a result, as illustrated in (a). At this time, the limit value is output from the battery controller 107 to the host controller 112, and the respective integrated values are reset to zero.

Even after time t2, the same processing as described above is repeated. That is, when the integrated value of the use time reaches the threshold C at time t3 as illustrated in (c), the limit value is output from the battery controller 107 to the host controller 112, and the respective integrated values are reset to zero. In addition, when the integrated value of the temperature reaches the threshold B at time t4 as illustrated in (b), the limit value is output from the battery controller 107 to the host controller 112, and the respective integrated values are reset to zero. Further, when the integrated value of the use time reaches the threshold C at time t5 as illustrated in (c), the limit value is output from the battery controller 107 to the host controller 112, and the respective integrated values are reset to zero. Thereafter, whenever any integrated value reaches the threshold thereof, the limit value is output from the battery controller 107 to the host controller 112, and the respective integrated values are reset to zero in the same manner.

Although the description has been given in the above-described example by exemplifying the respective integrated values of the charge/discharge current, the temperature, and the use time, the same description applies to another information of the battery modules 101. That is, the timing determination unit 204 calculates integrated values of a plurality of pieces of information on the battery module 101 acquired by the battery information acquisition unit 201, and compares each integrated value with each threshold thereof. As a result, when the integrated value exceeds the threshold regarding at least any one piece of the information, it is possible to determine as the timing at which the limit value needs to be output.

According to the first embodiment of the present invention described above, the following operational effects are achieved.

(1) The battery controller 107 is constituted by the battery information acquisition unit 201, the degradation progression rate calculation unit 202, the limit value setting unit 203, the timing determination unit 204, and the limit value output unit 205. The battery information acquisition unit 201 acquires the information on the battery module 101 which is the storage battery (step S101). The degradation progression rate calculation unit 202 calculates the degradation progression rate of the battery module 101 based on the information acquired by the battery information acquisition unit 201 (step S102). The limit value setting unit 203 sets the limit value for controlling the charge/discharge of the battery module 101 based on the degradation progression rate calculated by the degradation progression rate calculation unit 202 (step S103). The timing determination unit 204 determines the timing at which the limit value needs to be output based on the information acquired by the battery information acquisition unit 201 (steps S104 and S105). The limit value output unit 205 outputs the limit value based on the timing determined by the timing determination unit 204 (step S106). In this manner, it is possible to perform the charge/discharge control of the battery module 101 at an appropriate timing.

(2) The battery information acquisition unit 201 can acquire at least one of the charge/discharge current of the battery module 101, the temperature of the battery module 101, the use time of the battery module 101, and the charge state of the battery module 101 in step S101. Further, the battery information acquisition unit 201 can also acquire the travel distance of the vehicle on which the battery module 101 is mounted as the information on the battery module 101 in step S101. In this manner, it is possible to acquire various types of information relating to the state of the battery module 101.

(3) The timing determination unit 204 compares the integrated value of information with the predetermined threshold, and determines as the timing at which the limit value needs to be output when the integrated value exceeds the threshold in step S105. In this manner, it is possible to reliably and easily determine the timing at which the limit value needs to be output.

(4) The battery information acquisition unit 201 can acquire the plurality of pieces of information on the battery module 101 in step S101. In this case, the timing determination unit 204 calculates the respective integrated values of the plurality of pieces of information acquired by the battery information acquisition unit 201 in step S104. Then, it is determined as the timing at which the limit value needs to be output when the integrated value exceeds the threshold regarding at least any one piece of information in step S105. In this manner, it is possible to more appropriately determine the timing at which the limit value needs to be output.

Second Embodiment

Figure 6:
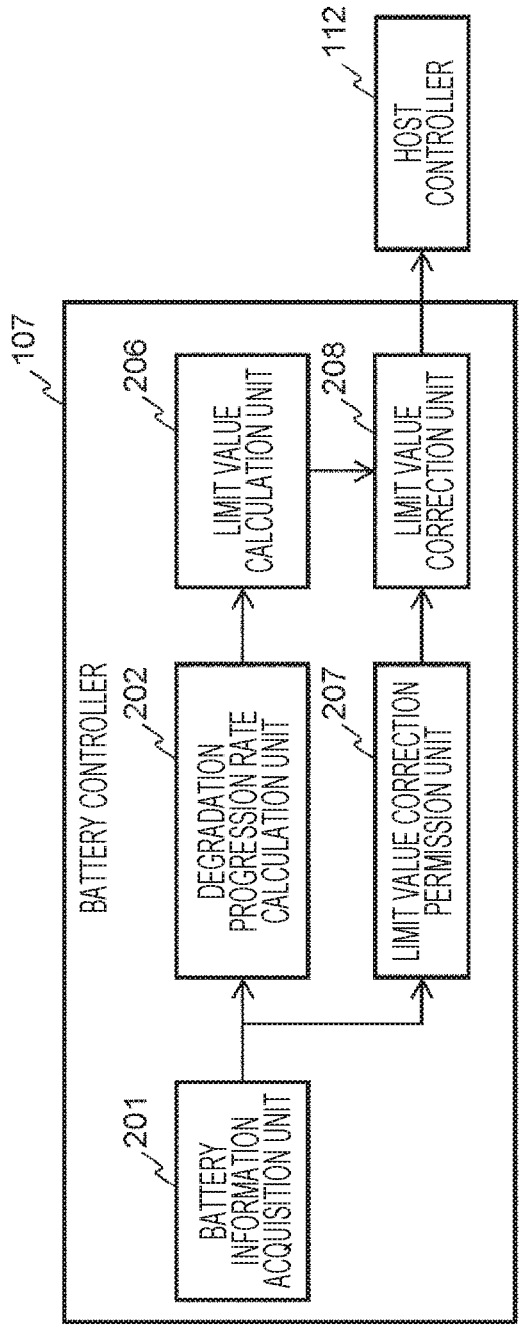
FIG. 6 is a functional block diagram of a battery controller according to a second embodiment of the present invention.

A second embodiment of the present invention will be described next. In the present embodiment, a description will be given regarding an example in which charge/discharge control different from that of the first embodiment described above is performed in the battery controller 107 illustrated in FIG. 1. FIG. 6 is a functional block diagram of the battery controller 107 according to the second embodiment of the present invention. As illustrated in FIG. 6, the battery controller 107 of the present embodiment is constituted by each functional block of a limit value calculation unit 206, a limit value correction permission unit 207, and a limit value correction unit 208 instead of the limit value setting unit 203, the timing determination unit 204, and the limit value output unit 205 in FIG. 2. The battery controller 107 can realize these functional blocks, for example, by executing a predetermined program using a CPU.

The limit value calculation unit 206 calculates a limit value for controlling charge/discharge of the battery module 101 based on a degradation progression rate calculated by the degradation progression rate calculation unit 202. The limit value calculation unit 206 can calculate the limit value in the same manner as the limit value setting unit 203 sets the limit value.

The limit value correction permission unit 207 determines whether or not to permit correction of the limit value, which is currently set, based on each piece of information such as current, temperature, an SOC, traveling distance, use time, and the like acquired by the battery information acquisition unit 201 as information on the battery module 101. Incidentally, a specific determination method using the limit value correction permission unit 207 will be described later.

When the limit value correction permission unit 207 permits the correction of the limit value, the limit value correction unit 208 corrects the limit value to be used for charge/discharge control of the battery module 101 based on the limit value obtained by the limit value calculation unit 206. Specifically, the limit value correction unit 208 corrects the limit value when the latest limit value obtained by the limit value calculation unit 206 is different from the limit value set in the current charge/discharge control and the limit value correction permission unit 207 has permitted the correction of the limit value. Then, the corrected limit value is output to the host controller 112. When the limit value is corrected by the limit value correction unit 208, the host controller 112 controls the battery system 100 and the inverter 110 according to this corrected limit value and performs the charge/discharge control of the battery module 101. Incidentally, when the correction of the limit value has not been permitted by the limit value correction permission unit 207 or when the limit value obtained by the limit value calculation unit 206 is not changed, the limit value correction unit 208 outputs the limit value that has been used in the charge/discharge control so far directly to the host controller 112 without any correction. In these cases, the host controller 112 continuously performs the charge/discharge control of the battery module 101 according to the limit value that has been used so far.

Figure 7:
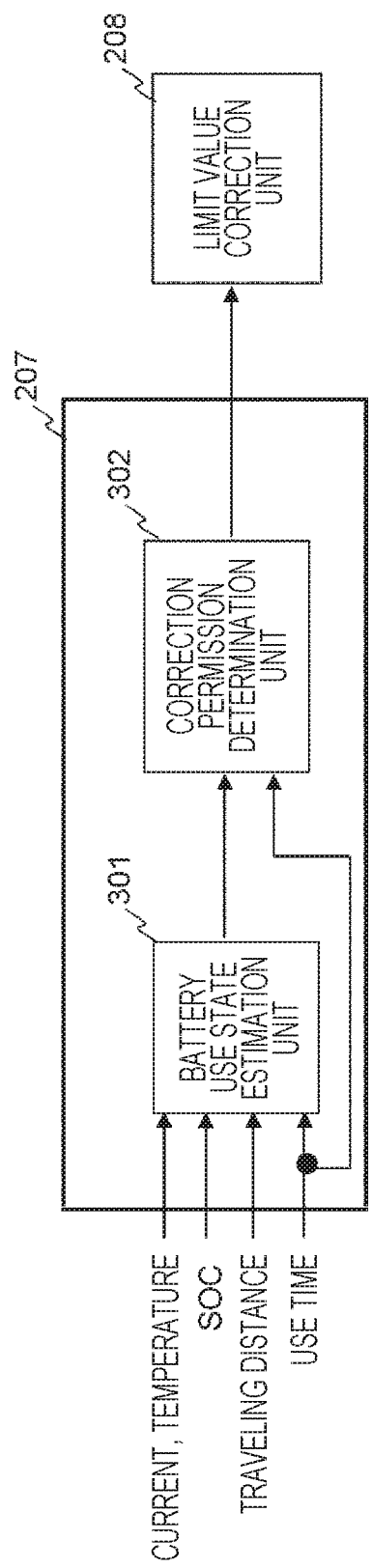
FIG. 7 is a functional block diagram of a limit value correction permission unit according to the second embodiment of the present invention.

FIG. 7 is a functional block diagram of the limit value correction permission unit 207 according to the second embodiment of the present invention. As illustrated in FIG. 7, the limit value correction permission unit 207 is constituted by each functional block of a battery use state estimation unit 301 and a correction permission determination unit 302.

The battery use state estimation unit 301 acquires the information such as the current, the temperature, the SOC, and the use time of the battery module 101 and the travel distance of a vehicle on which the battery module 101 is mounted from the battery information acquisition unit 201. Then, a use state of the battery module 101 is estimated based on these pieces of information.

The correction permission determination unit 302 determines whether or not to permit the correction of the limit value based on the use state of the battery module 101 estimated by the battery use state estimation unit 301 and the use time of the battery module 101. This determination result is output to the limit value correction unit 208.

Figure 8:
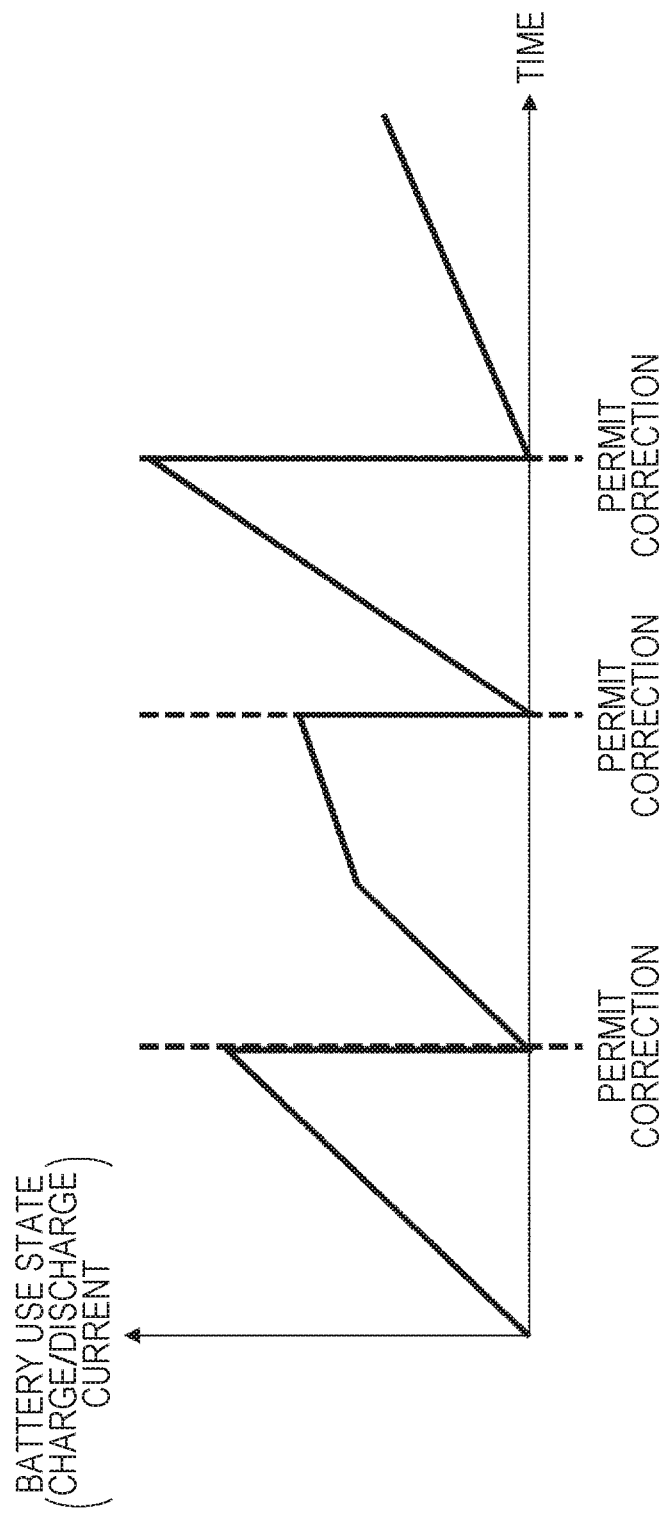
FIG. 8 is a diagram illustrating a method of estimating a battery use state based on charge/discharge current.

Next, a method of estimating the use state of the battery module 101 in the battery use state estimation unit 301 will be described. FIG. 8 is a diagram illustrating the method of estimating the battery use state based on charge/discharge current. Movement of lithium ions occurs inside the battery module 101 in accordance with charge and discharge. That is, at the time of charge, lithium ions are desorbed from the surface and inside of a positive electrode material and move in an electrolytic solution and diffuse into the material after reaching the surface of the positive electrode material. At the time of discharge, the reverse phenomenon occurs. The number of lithium ions moving in this manner increases as the charge/discharge current increases. In addition, the electrode material repeatedly expands and shrinks in accordance with the movement of lithium ions, and thus, the electrode material is exposed to a mechanical load as the charge and discharge are repeated. That is, the integrated value of the charge/discharge current correlates with the degradation of the battery module 101. Thus, it is possible to estimate the use state of the battery module 101 regarding the charge/discharge current in the battery use state estimation unit 301 by obtaining the integrated value of the charge/discharge current as illustrated in FIG. 8. Incidentally, when a sign of a value of the charge/discharge current varies depending on a flow direction of current, it is preferable to estimate the use state of the battery module 101 by integrating an absolute value of the charge/discharge current. Alternatively, the charge current and the discharge current maybe separately integrated.

When the correction permission determination unit 302 permits the correction of the limit value, the battery use state estimation unit 301 clears the integrated value of the charge/discharge current that has been integrated so far and starts integration again from zero as illustrated in FIG. 8. Incidentally, the integration of the charge/discharge current may be continued as it is without clearing the integrated value.

Figure 9:
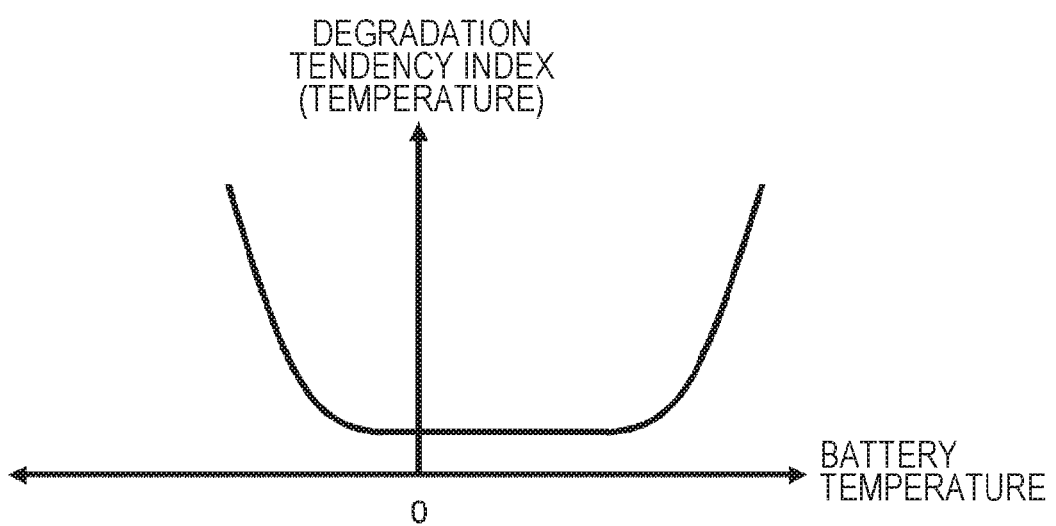
FIG. 9 is a view illustrating a method of estimating a battery use state based on temperature.
Figure 10:
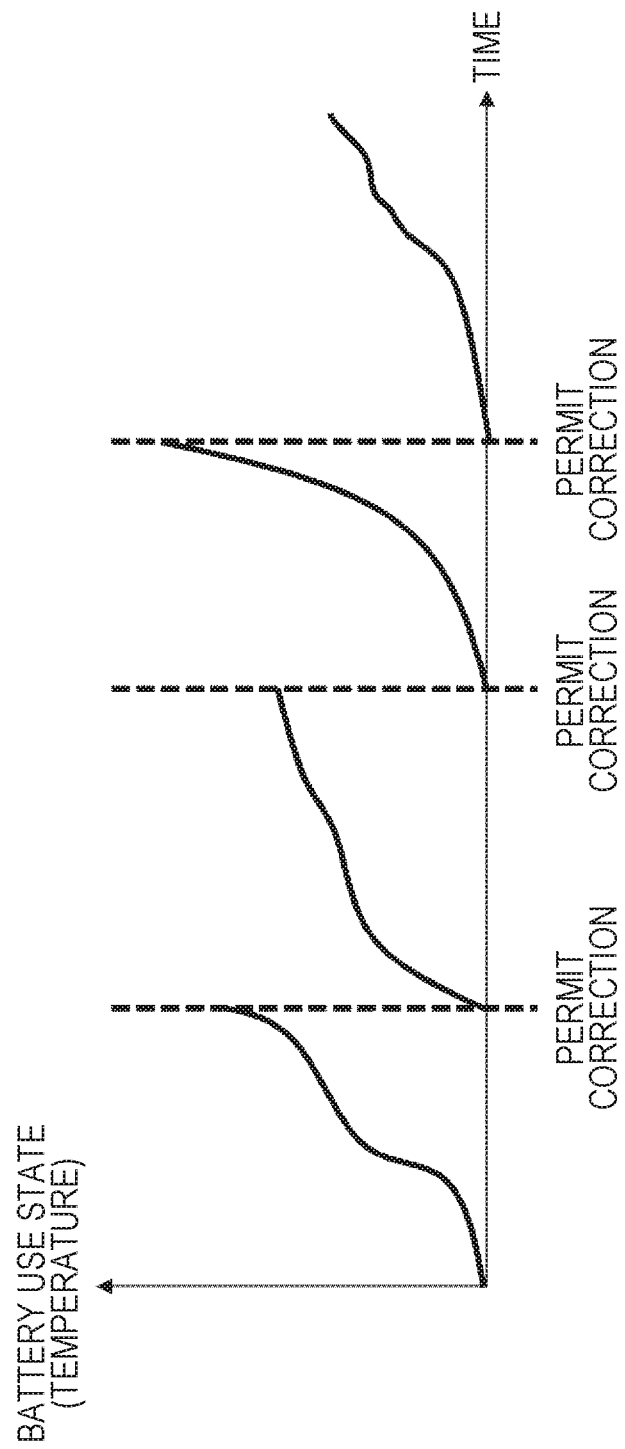
FIG. 10 is a diagram illustrating the method of estimating the battery use state based on the temperature.

FIGS. 9 and 10 are views illustrating a method of estimating the battery use state based on the temperature. In general, it is known that degradation is promoted when a lithium ion secondary battery such as the battery module 101 is used at high temperature or low temperature. A specific temperature condition at which the degradation is promoted varies depending on a material used for the battery module 101. Thus, the battery use state estimation unit 301 quantitatively determines a temperature range in which the degradation of the battery module 101 is promoted based on a relationship between battery temperature and promotion of the degradation, grasped in advance, as illustrated in FIG. 9, and obtains a degradation tendency index indicating a degradation tendency of the battery module 101. In the example illustrated in FIG. 9, the degradation tendency index of the battery module 101 exponentially increases as the battery temperature becomes lower or higher.

It is possible to estimate the use state of the battery module 101 regarding the temperature in the battery use state estimation unit 301 by obtaining an integrated value of the degradation tendency index based on the battery temperature as illustrated in FIG. 10. Although the description has been given regarding the example in which the relationship between the battery temperature and the degradation promotion is exponential, the method of estimating the use state of the battery module 101 regarding the temperature is not limited thereto. Here, it is important to be capable of estimating the use state of the battery module 101 regarding the temperature, based on the known relationship between the battery temperature and the degradation tendency.

When the correction permission determination unit 302 permits the correction of the limit value, the battery use state estimation unit 301 clears the integrated value of the degradation tendency index that has been integrated so far and starts integration again from zero as illustrated in FIG. 10. Incidentally, the integration of the degradation tendency index may be continued as it is without clearing the integrated value.

Figure 11:
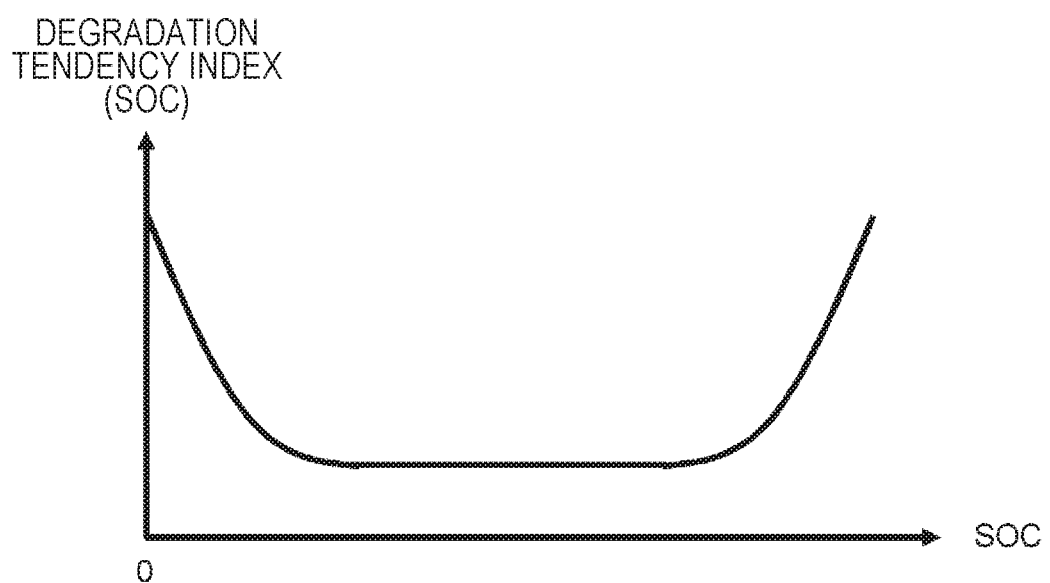
FIG. 11 is a diagram illustrating a method of estimating a battery use state based on an SOC.
Figure 12:
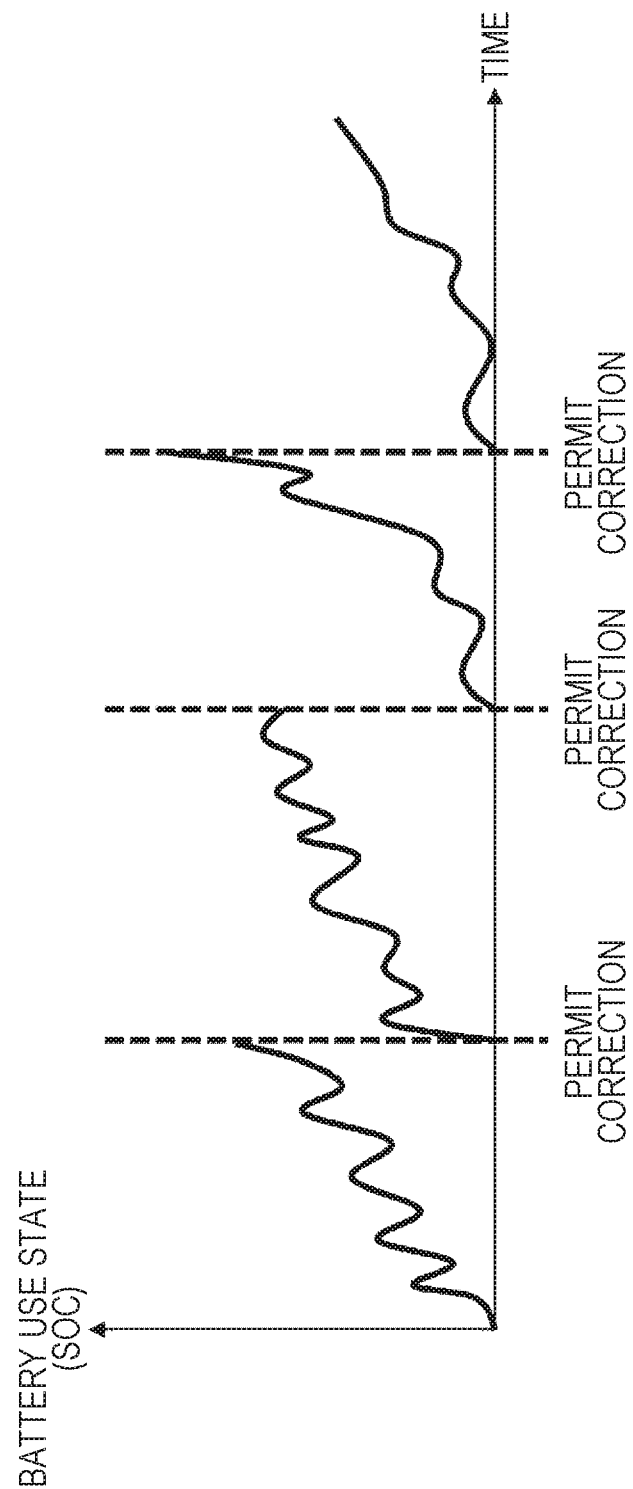
FIG. 12 is a diagram illustrating the method of estimating the battery use state based on the SOC.

FIGS. 11 and 12 are views illustrating a method of estimating the battery use state based on the SOC. In general, it is known that degradation is promoted when a lithium ion secondary battery such as the battery module 101 is used in a high SOC region or a low SOC region. A specific SOC region in which the degradation is promoted varies depending on a material used for the battery module 101. Thus, the battery use state estimation unit 301 quantitatively determines a SOC region in which the degradation of the battery module 101 is promoted based on a relationship between the SOC and promotion of the degradation, grasped in advance, as illustrated in FIG. 11, and obtains a degradation tendency index indicating a degradation tendency of the battery module 101. In the example illustrated in FIG. 11, the degradation tendency index of the battery module 101 exponentially increases as being used in a lower SOC region or a higher SOC region.

It is possible to estimate the use state of the battery module 101 regarding the SOC in the battery use state estimation unit 301 by obtaining an integrated value of the degradation tendency index based on the SOC as illustrated in FIG. 12. Although the description has been given regarding the example in which the relationship between the SOC and the degradation promotion is exponential, the method of estimating the use state of the battery module 101 regarding the SOC is not limited thereto. Here, it is also important to be capable of estimating the use state of the battery module 101 relating to the SOC, based on the known relationship between the SOC and the degradation tendency, which is similar to the case of the temperature described above.

When the correction permission determination unit 302 permits the correction of the limit value, the battery use state estimation unit 301 clears the integrated value of the degradation tendency index that has been integrated so far and starts integration again from zero as illustrated in FIG. 12. Incidentally, the integration of the degradation tendency index may be continued as it is without clearing the integrated value.

Figure 13:
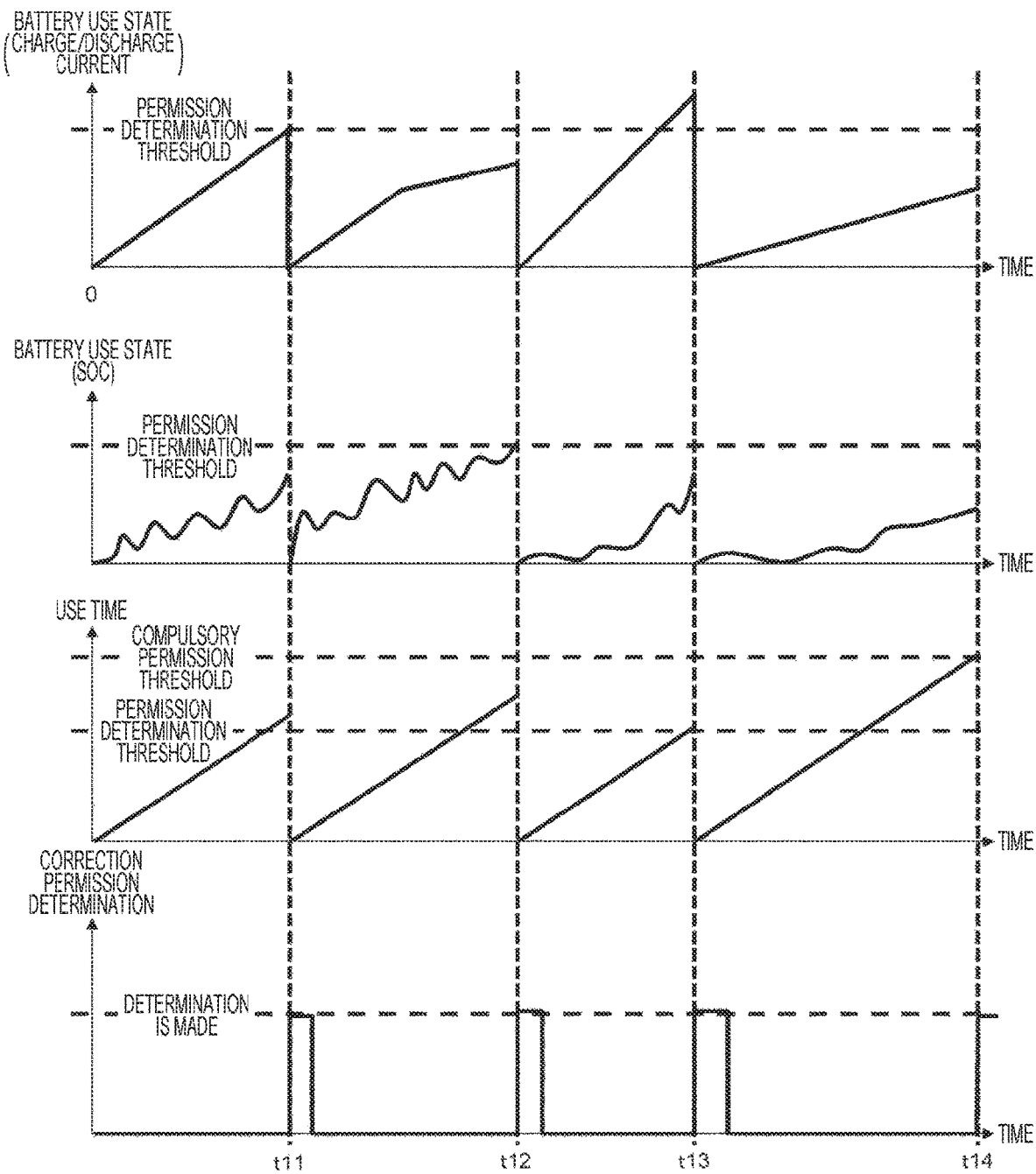
FIG. 13 is a diagram illustrating an example of a relationship between a battery use state and a correction permission determination result of a limit value.

Next, a description will be given regarding a method of performing determination on correction permission of the limit value in the correction permission determination unit 302 based on the use state of the battery module 101 estimated by the battery use state estimation unit 301. FIG. 13 is a diagram illustrating an example of a relationship between a battery use state and a correction permission determination result of a limit value. FIG. 13 illustrates a case where the determination on correction permission of the limit value is performed based on the battery use state relating to the charge/discharge current and the battery use state relating to the SOC described above, and the use time of the battery module 101. Although a detailed description will be omitted, the same description also applies to other use conditions.

When the use of the battery module 101 progresses from a change of a previous limit value and it is determined that an effect of the change is reflected in a change of a degradation state of the battery module 101, the correction permission determination unit 302 permits correction of the limit value. Specifically, the correction permission determination unit 302 integrates the charge/discharge current as the battery use state relating to the charge/discharge current, and sets the degradation tendency index based on the SOC as the battery use state relating to the SOC as illustrated in FIG. 13. At the same time, the use time of the battery module 101 is integrated as the battery use time. Then, when at least any one of the battery use state relating to the charge/discharge current or the battery use state relating to the SOC exceeds each predetermined permission determination threshold thereof set in advance and the battery use time exceeds a predetermined permission determination threshold, it is determined that the correction permission determination has been made and outputs a predetermined correction permission signal. After outputting the correction permission signal, the correction permission determination unit 302 resets each integrated value to zero and starts integration again.

In the example of FIG. 13, as the battery use state relating to the charge/discharge current exceeds the threshold at time t11 after the battery use time exceeds the threshold, the correction permission determination unit 302 determines that the correction permission determination is made, and outputs the correction permission signal. Thereafter, as the battery use state relating to the SOC exceeds the threshold at time t12 after the battery use time exceeds the threshold, the correction permission determination unit 302 determines that the correction permission determination is made and outputs the correction permission signal. Thereafter, as the battery use time exceeds the threshold at time t13 after the battery use state relating to the charge/discharge current exceeds the threshold, the correction permission determination unit 302 determines that the correction permission determination is made and outputs the correction permission signal. That is, in this case, it is determined that a sufficient time has not elapsed since the previous correction of the limit value until the battery use time exceeds the threshold after the value of the battery use state relating to the charge/discharge current exceeds the threshold, and the correction permission determination is not made. Thereafter, when the battery use time reaches the threshold, the correction permission determination is made.

Incidentally, at time t14, neither the battery use state relating to the charge/discharge current nor the battery use state relating to the SOC exceeds the threshold, but the battery use time exceeds a compulsory permission threshold. Thus, the correction permission determination unit 302 determines that the correction permission determination is made and outputs the correction permission signal. The compulsory permission threshold is set to a value higher than the above-described permission determination threshold. Accordingly, the correction permission determination unit 302 permits the correction of the limit value when a use frequency of the battery module 101 decreases, for example, since the vehicle on which the battery module 101 is mounted is left for a long period of time. That is, when the use frequency of the battery module 101 is low, the progress of degradation over time of the battery module 101 with the lapse of time is concerned even if the battery use state such as the charge/discharge current, the temperature, the SOC, and the traveling distance does not increase. In consideration of this, the correction permission determination unit 302 permits the correction of the limit value regardless of the battery use state when the battery use time exceeds the compulsory permission threshold.

Figure 14:
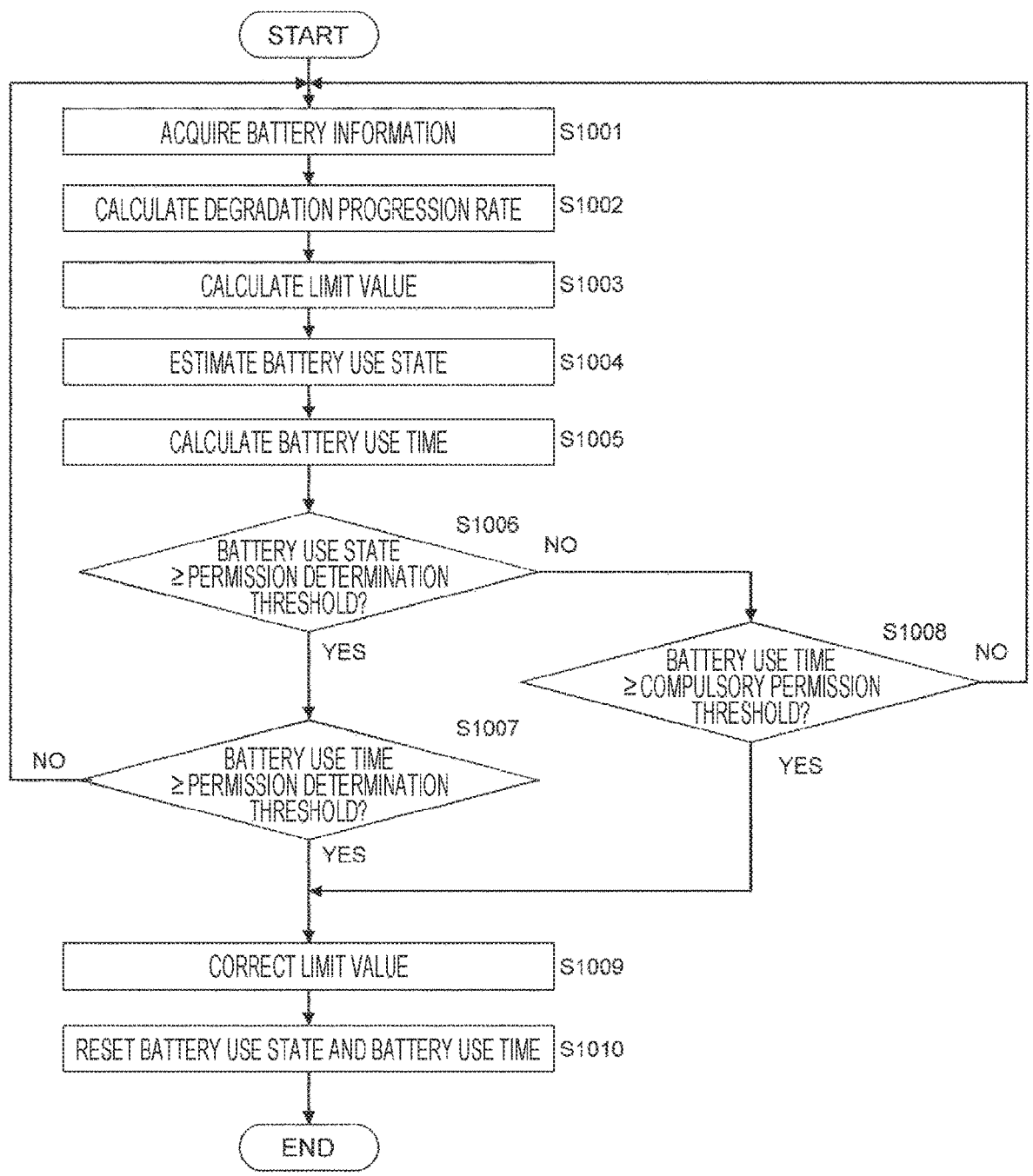
FIG. 14 is a flowchart of charge/discharge control of a battery module according to the second embodiment of the present invention.

FIG. 14 is a flowchart of the charge/discharge control of the battery module 101 using the battery controller 107 according to the second embodiment of the present invention. The battery controller 107 of the present embodiment executes the charge/discharge control of the battery module 101 at every predetermined processing cycle according to the flowchart of FIG. 14.

In steps S1001 to S1003, the battery controller 107 executes the same processes, respectively, as steps S101 to S103 of FIG. 3.

In step S1004, the battery controller 107 estimates the use state of the battery module 101 using the battery use state estimation unit 301 based on the information on the battery module 101 acquired in step S1001. Here, the use states of the battery module 101 regarding the charge/discharge current, the temperature, the SOC, and the like are estimated using the methods described with reference to FIGS. 8 to 12, respectively.

In step S1005, the battery controller 107 calculates the battery use time since the previous correction of the limit value using the battery use state estimation unit 301.

In step S1006, the battery controller 107 determines whether or not the battery use state estimated in step S1004 exceeds the permission determination threshold using the correction permission determination unit 302. As a result, the process proceeds to step S1007 if at least any one of the use states of the battery module 101 regarding the charge/discharge current, the temperature, the SOC, and the like is equal to or greater than the permission determination threshold thereof. On the other hand, if all the battery use states are less than the permission determination thresholds thereof, the process proceeds to step S1008.

In step S1007, the battery controller 107 determines whether or not the battery use time calculated in step S1005 exceeds the permission determination threshold using the correction permission determination unit 302. As a result, the process proceeds to step S1009 if the battery use time is equal to or longer than the permission determination threshold. On the other hand, if the battery use time is less than the permission determination threshold, the process returns to step S1001, and the processes of step S1001 and the subsequent steps are repeated. In this case, the correction of the limit value is not performed.

In step S1008, the battery controller 107 determines whether or not the battery use time calculated in step S1005 exceeds the compulsory permission threshold using the correction permission determination unit 302. As a result, the process proceeds to step S1009 if the battery use time is equal to or greater than the compulsory permission threshold. On the other hand, if the battery use time is less than the compulsory permission threshold, the process returns to step S1001, and the processes of step S1001 and the subsequent steps are repeated. Even in this case, the correction of the limit value is not performed.

In step S1009, the battery controller 107 corrects the limit value used for the charge/discharge control of the battery module 101 based on the limit value set in step S103 using the limit value correction unit 208. Then, the corrected limit value is output to the host controller 112.

In step S1010, the battery controller 107 resets each of the battery use state estimated in step S1004 and the battery use time calculated in step S1005 to zero using the battery use state estimation unit 301. After executing step S1010, the battery controller 107 ends the processing illustrated in the flowchart of FIG. 14.

According to the second embodiment of the present invention described above, the following operational effects are achieved.

(1) The battery controller 107 includes the battery information acquisition unit 201, the degradation progression rate calculation unit 202, the limit value calculation unit 206, the battery use state estimation unit 301, the correction permission determination unit 302, and the limit value correction unit 208. The battery information acquisition unit 201 acquires the information on the battery module 101 which is the storage battery (step S1001). The degradation progression rate calculation unit 202 calculates the degradation progression rate of the battery module 101 based on the information acquired by the battery information acquisition unit 201 (step S1002). The limit value calculation unit 206 calculates a limit value for controlling charge/discharge of the battery module 101 based on a degradation progression rate calculated by the degradation progression rate calculation unit 202 (step S1003). The battery use state estimation unit 301 estimates the use state of the battery module 101 based on the information acquired by the battery information acquisition unit 201 (step S1004). The correction permission determination unit 302 determines whether or not to permit the correction of the limit value based on the use state of the battery module 101 estimated by the battery use state estimation unit 301 and the use time of the battery module 101 (steps S1006 to S1008). The limit value correction unit 208 corrects the set limit value based on the limit value obtained by the limit value calculation unit 206 and the determination result obtained by the correction permission determination unit 302 (step S1009). In this manner, it is possible to perform the charge/discharge control of the battery module 101 at an appropriate timing, which is similar to the first embodiment.

(2) The battery information acquisition unit 201 acquires at least one of the charge/discharge current of the battery module 101, the temperature of the battery module 101, and the charge state of the battery module 101 in step S1001. In step S1004, the battery use state estimation unit 301 estimates at least any one of the use state of the battery module 101 relating to the charge/discharge current, the use state of the battery module 101 relating to the temperature, and the use state of the battery module 101 relating to the charge state. The correction permission determination unit 302 permits the correction of the limit value in step S1009 when it is determined in step S1006 that at least any one estimated value of the use state of the battery module 101 relating to the charge/discharge current, the use state of the battery module 101 relating to the temperature, and the use state of the battery module 101 relating to the charge state is greater than the predetermined threshold set in advance for each estimated value and it is determined in step S1007 that the use time of the battery module 101 is equal to or longer than the predetermined permission determination time. In this manner, it is possible to permit the correction of the limit value at an appropriate timing.

(3) When it is determined in step S1008 that the use time of the battery module 101 is equal to or longer than the predetermined compulsory permission time, the correction permission determination unit 302 permits the correction of the limit value in step S1009 regardless of the use state of the battery module 101. In this manner, it is possible to permit the correction of the limit value at an appropriate timing when the progress of the degradation over time of the battery module 101 with the lapse of time is concerned even if the change in the use state of the battery module 101 is small.

Incidentally, the present invention is not limited to the above-described embodiments. Other embodiments conceivable within a technical idea of the present invention are also included within the scope of the present invention.

Reference Signs List 100 battery system
101 battery module
102 current sensor
103 voltage sensor
104 temperature sensor
105 leakage sensor
106A, 106B relay
107 battery controller 110 inverter
111 load
112 host controller
201 battery information acquisition unit
202 degradation progression rate calculation unit
203 limit value setting unit
204 timing determination unit
205 limit value output unit
206 limit value calculation unit
207 limit value correction permission unit
208 limit value correction unit
301 battery use state estimation unit
302 correction permission determination unit

The Invention claimed is:

1. A storage battery control device comprising:
a battery information acquisition unit that acquires information on a storage battery;
a degradation progression rate calculation unit that calculates a degradation progression rate of the storage battery based on the information acquired by the battery information acquisition unit;
a limit value setting unit that sets a limit value for controlling charge/discharge of the storage battery based on the degradation progression rate calculated by the degradation progression rate calculation unit;
a timing determination unit that determines a timing at which the limit value needs to be output based on the information acquired by the battery information acquisition unit; and
a limit value output unit that outputs the limit value based on the timing determined by the timing determination unit, wherein
the battery information acquisition unit acquires a charge/discharge current of the storage battery, temperature of the storage battery, use time of the storage battery, and a charge state of the storage battery,
when: i) a discharge current of the storage battery and a SOC of the storage battery do not exceed a first threshold, and ii) the use time of the storage battery is equal to or longer than a predetermined compulsory permission time, a correction permission determination unit determines to permit correction of the limit value regardless of a use state of the storage battery.

2. The storage battery control device according to claim 1, wherein
the storage battery is mounted on a vehicle, and
the battery information acquisition unit acquires traveling distance of the vehicle as information on the storage battery.

3. The storage battery control device according to claim 1, wherein
the timing determination unit compares an integrated value of the information with a predetermined threshold, and determines as a timing at which the limit value needs to be output when the integrated value exceeds the threshold.

4. The storage battery control device according to claim 1, wherein
the battery information acquisition unit acquires a plurality of pieces of information on the storage battery, and the timing determination unit calculates each integrated value of the plurality of pieces of information acquired by the battery information acquisition unit and determines as a timing at which the limit value needs to be output when the integrated value exceeds the threshold regarding at least any one piece of information.

5. The storage battery control device according to claim 4, wherein the storage battery control device is configured to reset respective integrated values to zero using the timing determination unit.

6. A storage battery control device comprising:
a battery information acquisition unit that acquires information on a storage battery;
a degradation progression rate calculation unit that calculates a degradation progression rate of the storage battery based on the information acquired by the battery information acquisition unit;
a limit value calculation unit that calculates a limit value for controlling charge/discharge of the storage battery based on the degradation progression rate calculated by the degradation progression rate calculation unit;
a battery use state estimation unit that estimates a use state of the storage battery based on the information acquired by the battery information acquisition unit;
a correction permission determination unit that determines whether or not to permit correction of the limit value based on the use state of the storage battery estimated by the battery use state estimation unit and use time of the storage battery; and
a limit value correction unit that corrects the set limit value based on the limit value obtained by the limit value calculation unit and a determination result of the correction permission determination unit, wherein
the battery information acquisition unit acquires a charging/discharging current of the storage battery, a temperature of the storage battery, and a charge state of the storage battery,
the battery use state estimation unit estimates at least any one of a use state of the storage battery relating to the charge/discharge current, a use state of the storage battery relating to the temperature, and a use state of the storage battery relating to the charge state,
the correction permission determination unit permits correction of the limit value when an estimated value of the use state of the storage battery relating to the charge/discharge current, the use state of the storage battery relating to the temperature, and the use state of the storage battery relating to the charge state is greater than a predetermined threshold, set in advance for each estimated value, and the use time of the storage battery is equal to or longer than predetermined permission determination time,
when: i) a discharge current of the storage battery and a SOC of the storage battery do not exceed a first threshold, and ii) the use time of the storage battery is equal to or longer than a preterned compulsory permission time, a correction permission determination unit determines to permit correction of the limit value regardless of a use state of the storage battery.

* * * * *